(12) United States Patent
Zheng et al.

(10) Patent No.: US 12,379,270 B2
(45) Date of Patent: Aug. 5, 2025

(54) TORQUE OBTAINING METHOD AND DEVICE, MOTOR CONTROLLER, AND READABLE STORAGE MEDIUM

(71) Applicant: CONTEMPORARY AMPEREX TECHNOLOGY (HONG KONG) LIMITED, Hong Kong (CN)

(72) Inventors: Xiong Zheng, Ningde (CN); Xianxi Pan, Ningde (CN); Feilong Cai, Ningde (CN); Zhimin Dan, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 388 days.

(21) Appl. No.: 17/858,857

(22) Filed: Jul. 6, 2022

(65) Prior Publication Data

US 2023/0049854 A1 Feb. 16, 2023

Related U.S. Application Data

(63) Continuation of application No. PCT/CN2021/112492, filed on Aug. 13, 2021.

(51) Int. Cl.
*G01L 5/00* (2006.01)
*G01R 19/00* (2006.01)

(52) U.S. Cl.
CPC ............ *G01L 5/00* (2013.01); *G01R 19/0092* (2013.01)

(58) Field of Classification Search
CPC ...... E21B 43/128; G01L 5/00; G01R 19/0092
See application file for complete search history.

(56) References Cited

U.S. PATENT DOCUMENTS

2018/0094512 A1* 4/2018 Sadilek ................ E21B 43/128

FOREIGN PATENT DOCUMENTS

| CN | 101783637 B | 1/2012 |
| CN | 10661207 A | 5/2017 |
| CN | 107070342 A | 8/2017 |
| CN | 108551287 A | 9/2018 |

(Continued)

OTHER PUBLICATIONS

Kaihui Zhao et al., "Robust Closed-loop Torque Control for PMSM of Railway Traction Considering Demagnetization", IECON 2019—45th Annual Conference of the IEEE Industrial Electronics Society, Lisbon, Portugal, 2019, pp. 6916-6921.

(Continued)

*Primary Examiner* — Lam S Nguyen
(74) *Attorney, Agent, or Firm* — ANOVA LAW GROUP, PLLC

(57) ABSTRACT

Embodiments of this application provide a torque obtaining method and device, a motor controller, and a readable storage medium. The torque obtaining method includes: obtaining a rotation speed of a motor; obtaining a current of the motor; obtaining a flux linkage of the motor; determining an electromagnetic torque of the motor based on the current and the flux linkage; and inputting the rotation speed and the electromagnetic torque into a preset status observer, and obtaining an observed value of an actual output torque of the motor, where the observed value is output by the status observer. The obtaining method is intended to obtain the actual output torque effectively, simply, and accurately.

18 Claims, 4 Drawing Sheets

(56) References Cited

FOREIGN PATENT DOCUMENTS

| | | | |
|---|---|---|---|
| CN | 111086399 A | 5/2020 | |
| CN | 111769779 A | 10/2020 | |
| CN | 112332739 A * | 2/2021 | ............. H02P 23/20 |
| CN | 112671284 A | 4/2021 | |
| CN | 112838799 A | 5/2021 | |
| CN | 113238995 A | 8/2021 | |
| EP | 2747273 A1 | 6/2014 | |
| WO | WO2020244954 A1 | 12/2020 | |

OTHER PUBLICATIONS

The European Patent Office (EPO) Extended Search Report for EP Application No. 21904629.9, Jul. 24, 2023 5 Pages.
International Search Report and Written Opinion, PCT/CN2021/112492, Apr. 15, 2022, 13 pgs.

* cited by examiner

TORQUE OBTAINING METHOD AND DEVICE, MOTOR CONTROLLER, AND READABLE STORAGE MEDIUM

CROSS-REFERENCE TO RELATED APPLICATION

This application is a continuation application of PCT Patent Application No. PCT/CN2021/112492, entitled "TORQUE ACQUISITION METHOD AND DEVICE, MOTOR CONTROLLER, AND READABLE STORAGE MEDIUM" filed on Aug. 13, 2021, which is incorporated herein by reference in its entirety.

TECHNICAL FIELD

This application relates to the technical field of motor control, and in particular, to a torque obtaining method and device, a motor controller, and a readable storage medium.

BACKGROUND

A power drive system of a new energy vehicle mainly includes a three-phase permanent-magnet synchronous motor, and also includes some type of three-phase induction motors. Usually, a drive motor of the new energy vehicle is controlled by a torque, so as to better adapt to the operating conditions of the vehicle such as starting, accelerating, decelerating, braking, and the like. In the control process, an actual output torque of the drive motor is an essential reference variable, and is fed back to a vehicle controller to protect safe operation of the vehicle, diagnose faults of a control system, and implement protection policies.

In the prior art, the actual output torque may be obtained by many methods such as sensor sampling, power balancing, flux linkage estimating. Such methods are unable to implement effective and simple obtaining of the output torque, or unable to implement accurate obtaining of the output torque.

SUMMARY

An objective of this application is to provide a torque obtaining method and device, a motor controller, and a readable storage medium to obtain an actual output torque effectively, simply, and accurately.

According to a first aspect, this application provides a torque obtaining method, including: obtaining a rotation speed of a motor; obtaining a current of the motor; obtaining a flux linkage of the motor; determining an electromagnetic torque of the motor based on the current and the flux linkage; and inputting the rotation speed and the electromagnetic torque into a preset status observer, and obtaining an observed value of an actual output torque of the motor, where the observed value is output by the status observer.

In this application, in comparison with the prior art, when determining the actual output torque, the obtained motor parameters include: the rotation speed of the motor, the flux linkage of the motor, and the current of the motor. The three parameters can be collected by an inherent sampling module in a drive system or obtained through simple calculation based on the parameters collected by the sampling module, without a need to add any additional parameter collection module in the drive system. Therefore, the actual output torque can be obtained effectively, simply, and cost-effectively. Further, based on the rotation speed and current, the electromagnetic torque is determined first, and then the rotation speed and the electromagnetic torque are input into the preset status observer to obtain the observed value of the actual output torque of the motor, where the observed value is output by the status observer. The observed value of the actual output torque, which is output by the status observer, is relatively accurate. Therefore, the actual output torque can be obtained accurately and reliably.

In a possible implementation, the preset status observer outputs the observed value of the actual output torque of the motor based on the following calculation formula:

$$\dot{\hat{w}}_m = \frac{1}{J} * (T_{elc} - \hat{T}_{load} - B * \hat{w}_m + J * L1 * (w_m - \hat{w}_m)),$$

$$\dot{\hat{T}}_{load} = L2 * (w_m - \hat{w}_m),$$

where, $w_m$ is the rotation speed, $T_{elc}$ is the electromagnetic torque, $\hat{w}_m$ is an observed value of the rotation speed, B is a damping coefficient of the motor, J is a moment of inertia of the motor, $\dot{\hat{w}}_m$ is a derivative of the observed value of the rotation speed, $\hat{T}_{load}$ is the observed value of the actual output torque, $\dot{\hat{T}}_{load}$ is a derivative of the observed value of the actual output torque, L1 is a preset first control parameter, and L2 is a preset second control parameter. The observed value of the rotation speed is determined by integrating the derivative of the observed value of the rotation speed.

In this application, the above calculation formula corresponds to a Luenberger observer. Based on the rotation speed and electromagnetic torque of the motor, the actual output torque can be obtained accurately and reliably through the Luenberger observer.

In a possible implementation, the current includes a q-axis current and a d-axis current, the flux linkage includes a q-axis flux linkage and a d-axis flux linkage, and the determining an electromagnetic torque of the motor based on the current and the flux linkage includes: determining the electromagnetic torque of the motor based on the current, the flux linkage, and a preset electromagnetic torque calculation formula, where the electromagnetic torque calculation formula is expressed as: $T_{elc}=1.5*Pn*(\psi_d*iq-\psi_q*id)$, where, $T_{elc}$ is the electromagnetic torque, Pn is a number of pole pairs of the motor, iq is the q-axis current, id is the d-axis current, $\psi_q$ is the q-axis flux linkage, and $\psi_q$ is the d-axis flux linkage.

In this application, the electromagnetic torque is effectively determined based on the d-axis and q-axis currents, the d-axis and q-axis flux linkages, and the preset electromagnetic torque calculation formula.

In a possible implementation, the current includes a q-axis current and a d-axis current, the flux linkage includes a q-axis flux linkage and a d-axis flux linkage, and the obtaining a flux linkage of the motor includes: obtaining an internal resistance of a winding of the motor; determining a q-axis voltage based on the q-axis current and a preset q-axis current, and determining a d-axis voltage based on the d-axis current and a preset d-axis current; and determining the d-axis flux linkage based on the internal resistance of the winding, the rotation speed, and the q-axis voltage, and determining the q-axis flux linkage based on the internal resistance of the winding, the rotation speed, and the d-axis voltage.

In this application, the corresponding d-axis voltage and q-axis voltage are determined based on the d-axis current and q-axis current of the motor respectively; and the corresponding d-axis flux linkage and q-axis flux linkage are effectively determined based on the corresponding q-axis voltage, d-axis voltage, the rotation speed, and the internal resistance of the winding.

In a possible implementation, the d-axis flux linkage is expressed as $\psi_d=(uq-Rs*iq)/w_m$, and the q-axis flux linkage is expressed as $\psi_q=(-ud+Rs*id)/w_m$, where, Rs is the internal resistance of the winding, $w_m$ is the rotation speed, uq is the q-axis voltage, and ud is the d-axis voltage.

In this application, based on the preset calculation formula of the flux linkage of the corresponding axis, the obtained rotation speed, and the voltage of the corresponding axis, the corresponding d-axis and q-axis flux linkages are determined effectively.

In a possible implementation, the obtaining a current of the motor includes: obtaining a three-phase current of the motor and a rotor angle of the motor; and determining a two-phase current of the motor based on the three-phase current, the rotor angle, and a preset coordinate transformation algorithm.

In this application, based on the three-phase current and the rotor angle of the motor, and the preset coordinate transformation algorithm, the two-phase current of the motor is determined effectively, thereby facilitating subsequent use of the two-phase current.

In a possible implementation, the obtaining method further includes: obtaining status information of the motor; obtaining a wind friction force of the motor at the rotation speed; and correcting the observed value of the actual output torque based on the status information and the wind friction force, so as to obtain a corrected actual output torque.

In this application, by obtaining the status information and the wind friction force of the motor, the observed value of the actual output torque is corrected, thereby further improving the accuracy of the actual output torque.

In a possible implementation, the correcting the observed value of the actual output torque based on the status information and the wind friction force, so as to obtain a corrected actual output torque, includes: subtracting, when determining that the status information is that the motor is in an electromotive state and the motor is rotating forward, the wind friction force from the observed value of the actual output torque to obtain the corrected actual output torque.

In this application, when it is determined that the motor is in the electromotive state and the motor is rotating forward, the wind friction force reduces the actual output torque. The wind friction force is subtracted from the observed value of the actual output torque to obtain a more accurate actual output torque.

In a possible implementation, the correcting the observed value of the actual output torque based on the status information and the wind friction force, so as to obtain a corrected actual output torque, includes: adding, when determining that the status information is that the motor is in an electromotive state and the motor is rotating reversely, the observed value of the actual output torque and the wind friction force to obtain the corrected actual output torque.

In this application, when it is determined that the motor is in the electromotive state and the motor is rotating reversely, the wind friction force increases the actual output torque. The observed value of the actual output torque and the wind friction force are added to obtain a more accurate actual output torque.

In a possible implementation, the obtaining method further includes: obtaining a temperature of the motor; determining, based on the temperature and a preset correspondence, a deviation coefficient corresponding to the temperature, where the preset correspondence is a correspondence between the temperature and the deviation coefficient; and correcting the observed value of the actual output torque based on the deviation coefficient corresponding to the temperature, so as to obtain a corrected actual output torque.

In this application, a correspondence between the temperature and the deviation coefficient is preset. The corresponding deviation coefficient is determined based on the temperature of the motor. The observed value of the actual output torque is corrected based on the deviation coefficient, thereby further improving the accuracy of the actual output torque.

In a possible implementation, the corrected actual output torque is expressed as: $T_{act}=(1-K)\times \hat{T}_{load}$, where, K is the deviation coefficient corresponding to the temperature, and $\hat{T}_{load}$ is the observed value of the actual output torque.

In this application, based on the preset relationship between the deviation coefficient and the observed value of the actual output torque, the corrected actual output torque is determined effectively, thereby improving the accuracy of the actual output torque.

In a second aspect, this application provides a torque obtaining device, including all function modules for implementing the torque obtaining method described in the first aspect and in any one of the possible implementations of the first aspect.

According to a third aspect, this application provides a motor controller. The motor controller includes a processor and a memory communicationally connected to the processor. The memory stores an instruction executable by the processor. The instruction is executed by the processor so that the processor is enabled to perform the torque obtaining method described in the first aspect and in any one of the possible implementations of the first aspect.

According to a fourth aspect, this application provides a vehicle, including a drive motor and the motor controller according to the third aspect.

According to a fifth aspect, this application provides a readable storage medium on which a computer program is stored. When run by a computer, the computer program performs the torque obtaining method described in the first aspect and in any one of the possible implementations of the first aspect.

BRIEF DESCRIPTION OF DRAWINGS

To describe the technical solutions in the embodiments of this application more clearly, the following outlines the drawings used in the embodiments of this application. Evidently, the drawings outlined below are merely a part of embodiments of this application. A person of ordinary skill in the art may derive other drawings from the outlined drawings without making any creative efforts.

Figure 1:
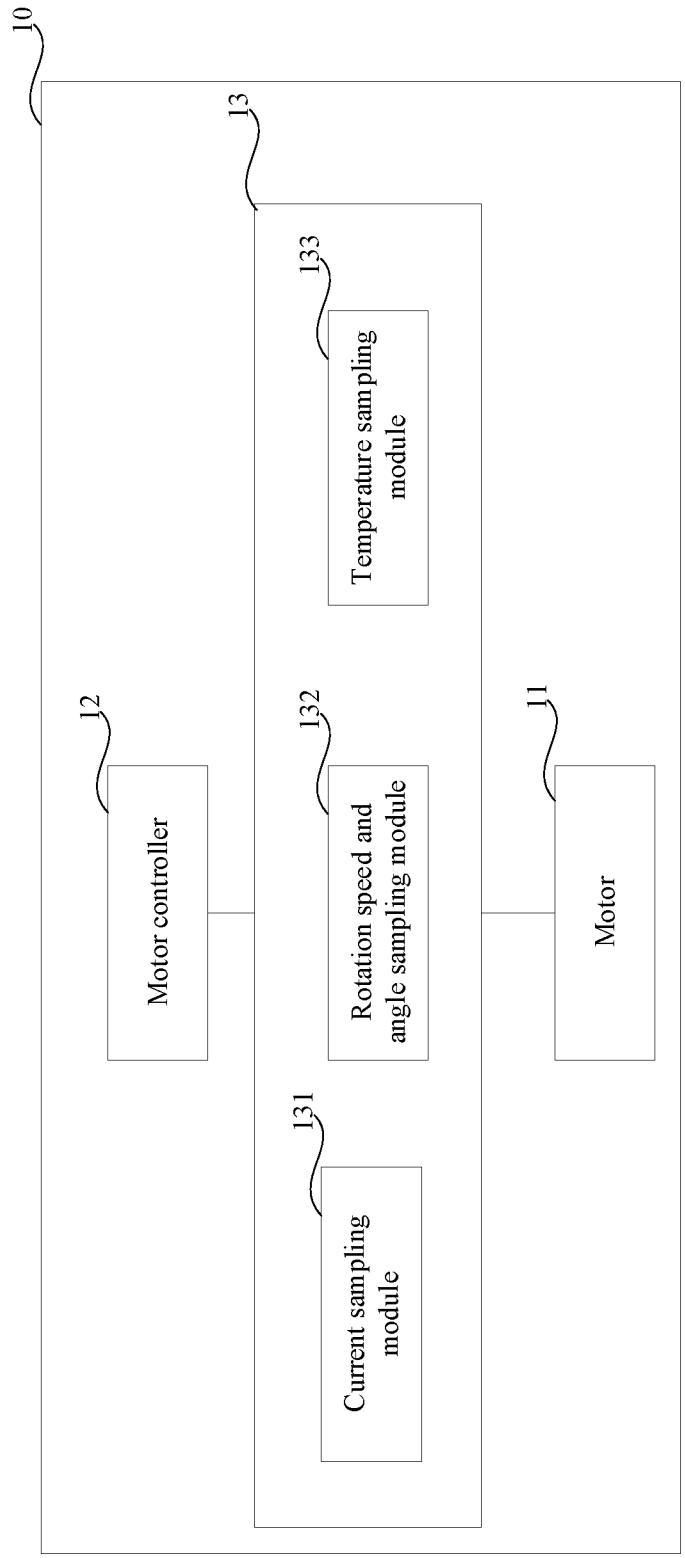
FIG. 1 is a structural block diagram of a drive system according to an embodiment of this application.

The drawings are not drawn to scale.

Reference numerals: 10—drive system; 11—motor; 12—motor controller; 120— processor; 121—memory;

122—communications module; 13—sampling module; 131— current sampling module; 132—rotation speed and angle sampling module; 133— temperature sampling module; 400—torque obtaining device; 410—obtaining module; and 420—processing module.

DETAILED DESCRIPTION OF EMBODIMENTS

The following gives a more detailed description of implementations of this application with reference to drawings and embodiments. The detailed description of the following embodiments and the accompanying drawings are intended to exemplarily describe the principles of this application, but not to limit the scope of this application. Therefore, this application is not limited to the described embodiments.

In the description of this application, unless otherwise specified, "a plurality of" means two or more; the terms such as "upper", "lower", "left", "right", "inner", and "outer" indicating a direction or a position relationship are merely intended for ease or brevity of description of this application, but do not indicate or imply that the device or component referred to must be located in the specified direction or constructed or operated in the specified direction. Therefore, such terms shall not be understood as a limitation to this application. In addition, the terms "first", "second", and "third" are merely intended for descriptive purposes, but are not intended to indicate or imply relative importance. "Perpendicular" is not exactly perpendicular, but within an error tolerance range. "Parallel" is not exactly parallel, but within an error tolerance range.

The directional terms appearing in the following description indicate the directions shown in the drawings, but are not intended to limit specific structures in this application. In the context of this application, unless otherwise expressly specified, the terms "mount", "concatenate", and "connect" are understood in a broad sense. For example, a "connection" may be a fixed connection, a detachable connection, or an integrated connection, and may be a direct connection or an indirect connection implemented through an intermediary. A person of ordinary skill in the art can understand the specific meanings of the terms in this application according to specific situations.

The technical solutions provided in the embodiments of this application can be used to control a drive motor. The drive motor may be a drive motor in a drive system of a new energy vehicle. Therefore, the drive motor may be a three-phase permanent-magnet synchronous motor or a three-phase induction motor.

When controlling the drive motor of a new energy vehicle, a torque mode may be used. In the torque mode, an actual output torque of the drive motor needs to be obtained first, and then a vehicle controller can control the drive motor effectively based on the actual output torque. In this process, the obtaining of the actual output torque depends on a motor controller of the drive motor.

In view of application scenarios of the new energy vehicle, refer to FIG. 1, which is a schematic diagram of a drive system 10 according to an embodiment of this application. In FIG. 1, the drive system 10 includes a motor 11, a motor controller 12, and a sampling module 13.

The sampling module 13 includes: a current sampling module 131, a rotation speed and angle sampling module 132, and a temperature sampling module 133.

The current sampling module 131 is configured to collect a current of the motor. The rotation speed and angle sampling module 132 is configured to collect a rotation speed of the motor and an angle of a rotor. The temperature sampling module 133 is configured to collect a temperature of the motor, for example, a temperature value of a winding of the motor. Hardware implementations of each sampling module 13 can be learned by referring to the mature technology in this field, and are not described in detail in the embodiments of this application.

The sampling module 13 is installed on the motor 11 or connected to the motor 11 depending on a corresponding sampling method. For example, if the temperature sampling module 133 needs to collect the temperature value of the winding of the motor 11 in real time, the sampling module is installed on the winding of the motor 11 correspondingly. For another example, the rotation speed and angle sampling module 132 needs to collect the rotation speed and angle of the rotor of the motor 11, the sampling module is physically connected to the rotor of the motor 11.

The motor controller 12 is connected to the sampling module 13. The sampling module 13 sends collected data to the motor controller 12, and then the motor controller 12 determines a torque based on the torque obtaining method according to an embodiment of this application.

Understandably, the motor controller 12 is further connected to a vehicle controller of the new energy vehicle to transmit the obtained actual output torque to the vehicle controller.

The motor 11 and the motor controller 12 are also connected to each other so that the motor controller 12 exercises all kinds of control over the motor 11.

Figure 2:
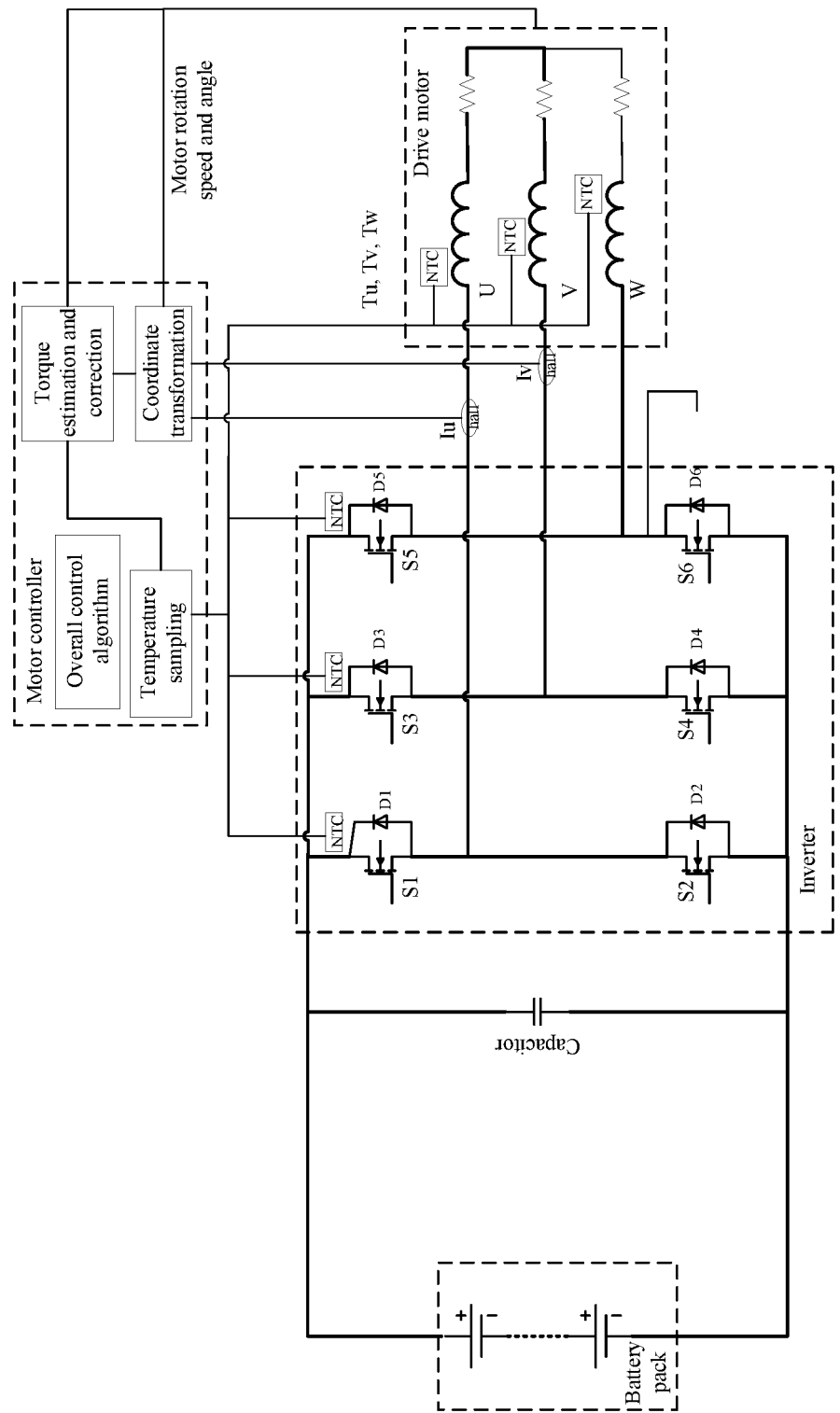
FIG. 2 is an exemplary circuit structure diagram of a drive system according to an embodiment of this application.

For ease of understanding, refer to FIG. 2, which is an exemplary circuit structure diagram of a drive system 10 according to an embodiment of this application. In FIG. 2, the motor 11 is a drive motor, and the temperature sampling module 133 is a negative temperature coefficient (NTC) resistor, the current sampling module 131 collects a three-phase current, and a rotation speed and angle sampling module 132 collects a rotation speed and an angle of the entire drive motor. In FIG. 2, just the NTC resistor is shown, but the current sampling module 131 and the rotation speed and angle sampling module 132 are not shown.

The NTC resistor, the current sampling module 131, and the rotation speed and angle sampling module 132 send collected information to the motor controller 12 separately, the motor controller 12 processes the information.

The motor controller 12 implements corresponding data processing through built-in algorithms such as an overall control algorithm, a torque estimation and correction algorithm, a temperature sampling algorithm, and a coordinate transformation algorithm.

In FIG. 2, the drive system further includes modules such as a battery pack, an inverter, a capacitor, and a power and temperature collection module. Such modules are basic modules in the drive system 10 and are not described in detail here.

Figure 3:
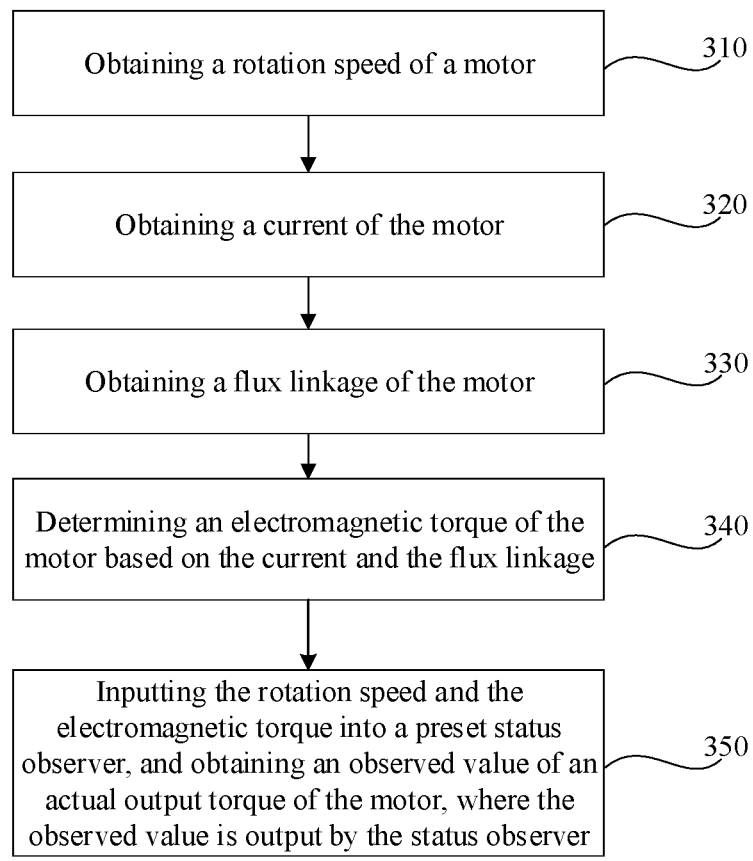
FIG. 3 is a flowchart of a torque obtaining method according to an embodiment of this application.

With reference to the description of the above application scenarios, refer to FIG. 3, which is a flowchart of a torque obtaining method according to embodiment of this application. The hardware environment corresponding to the obtaining method is a motor controller 12. The obtaining method includes:

Step 310: Obtaining a rotation speed of a motor 11;
Step 320: Obtaining a current of the motor 11;
Step 330: Obtaining a flux linkage of the motor 11;
Step 340: Determining an electromagnetic torque of the motor based on the current and the flux linkage; and
Step 350: Inputting the rotation speed and the electromagnetic torque into a preset status observer, and obtaining an observed value of an actual output torque of the motor 11, where the observed value is output by the status observer.

In this embodiment of this application, in comparison with the prior art, when determining the actual output torque, the obtained motor parameters include: the rotation speed of the motor 11, the flux linkage of the motor 11, and the current of the motor. The three parameters can be collected by a sampling module 13 or obtained through simple calculation based on the parameters collected by the sampling module 13, without a need to add any additional parameter collection module in the drive system 10. Therefore, the actual output torque can be obtained effectively, simply, and cost-effectively. Further, based on the rotation speed and current, the electromagnetic torque is determined first, and then the rotation speed and the electromagnetic torque are input into the preset status observer to obtain the observed value of the actual output torque of the motor 11, where the observed value is output by the status observer. The observed value of the actual output torque, which is output by the status observer, is relatively accurate. Therefore, the actual output torque can be obtained accurately and reliably.

Next, a detailed implementation of the obtaining method is described.

In step 310, the rotation speed of the motor can be obtained by the rotation speed and angle sampling module 132.

In step 320, the current can be obtained by the current sampling module 131. The drive motor is typically a three-phase drive motor. Correspondingly, the current sampling module 131 is a three-phase current sampling module, and the current collected by the current sampling module is a three-phase current.

Therefore, in step 320, the motor controller 12 may first obtain the three-phase current collected by the current sampling module 131, and then process the three-phase current to obtain a two-phase current for subsequent use. Correspondingly, in an embodiment, step 320 includes: obtaining a three-phase current of the motor 11 and a rotor angle of the motor 11; and determining a two-phase current of the motor 11 based on the three-phase current, the rotor angle, and a preset coordinate transformation algorithm.

The three-phase current of the motor 11 is collected by the current sampling module 131, and can be directly obtained from the current sampling module 131. The rotor angle of the motor 11 is collected by the rotation speed and angle sampling module 132, and can be directly obtained from the rotation speed and angle sampling module 132.

Assuming that the three-phase current is a U-V-W three-phase actual current, through the preset coordinate transformation algorithm, the current can be transformed from an a-b-c three-phase coordinate system into a d-q axis rectangular coordinate system, so as to obtain d-axis and q-axis two-phase currents.

It is assumed that the three-phase currents are iu, iv, and iw, respectively, the transformed two-phase currents are id and iq, respectively, and the rotor angle is θ. Therefore, in an implementation, the preset coordinate transformation algorithm may be expressed as: $iq=2*(iu-0.5*(iv+iw))*\cos(\theta)/3+\sqrt{3}*(iv-iw)*\sin(\theta)/3$; and $id=\sqrt{3}*(iv-iw)*\cos(\theta)/3-2*(iu-0.5*(iv+iw))*\sin(\theta)/3$.

In this implementation, based on the three-phase current and the rotor angle of the motor 11, and the preset coordinate transformation algorithm, the two-phase current of the motor 11 is determined effectively, thereby facilitating subsequent use of the two-phase current.

In step 330, the flux linkage of the motor 11 is obtained. The parameter flux linkage cannot be directly collected by the sampling module 13, but can be determined based on the parameters collected by the sampling module 13. With reference to the implementation of step 320, the current finally determined in step 320 includes a q-axis current and a d-axis current. Correspondingly, the flux linkage obtained in step 330 also includes a q-axis flux linkage and a d-axis flux linkage.

In an implementation, step 330 includes: obtaining an internal resistance of a winding of the motor 11; determining a q-axis voltage based on the q-axis current and a preset q-axis current, and determining a d-axis voltage based on the d-axis current and a preset d-axis current; and determining the d-axis flux linkage based on the internal resistance of the winding, the rotation speed, and the q-axis voltage, and determining the q-axis flux linkage based on the internal resistance of the winding, the rotation speed, and the d-axis voltage.

The internal resistance of the winding can be determined based on the winding temperature collected by the temperature sampling module 13 and a preset correspondence between the internal resistance of the winding and the temperature.

In an implementation, assuming that the internal resistance of the winding is Rs, which may be expressed as: $R_s = R_0 * (1 + 0.00393 * (temp - 25))$, where, $R_0$ is the internal resistance of the winding at 25° C., and temp is a real-time winding temperature collected by the temperature sampling module 13.

The preset q-axis current is a given q-axis current. The given q-axis current is different in different application scenarios. Similarly, the preset d-axis current is a given d-axis current. The given d-axis current is different in different application scenarios.

The q-axis current and the d-axis current obtained in step 320 may be understood as the actual q-axis current and the actual d-axis current respectively.

Based on the actual q-axis current and the preset q-axis current, a current error between the two currents is subjected to proportional integration, and then the two currents are output under control, thereby obtaining a corresponding q-axis voltage. Based on the actual d-axis current and the preset d-axis current, a current error between the two currents is subjected to proportional integration, and then the two currents are output under control, thereby obtaining a corresponding d-axis voltage.

After the internal resistance of the winding, the d-axis voltage, and the q-axis voltage are determined, the q-axis flux linkage and the d-axis flux linkage can be determined with reference to the rotation speed, thereby determining the flux linkage effectively.

In an implementation, the d-axis flux linkage is expressed as $\psi_d = (uq - Rs*iq)/w_m$, and the q-axis flux linkage is expressed as $\psi_q = (-ud + Rs*id)/w_m$, where, Rs is the internal resistance of the winding, $w_m$ is the rotation speed, uq is the q-axis voltage, and ud is the d-axis voltage.

In this embodiment of this application, based on the preset calculation formula of the flux linkage of the corresponding axis, the obtained rotation speed, and the voltage of the corresponding axis, the corresponding d-axis and q-axis flux linkages are determined effectively.

Understandably, in steps 310 to 330, the rotation speed, the current, and the flux linkage are obtained respectively. In practical applications, the implementation order of the three steps is not limited. The three steps may be performed in corresponding order, or may be performed simultaneously.

In step 340, the electromagnetic torque of the motor 11 is determined based on the current and the flux linkage. With reference to the two-phase current and the two-phase flux linkage described in the preceding embodiment, in an implementation, step 340 includes: determining the electromagnetic torque of the motor 11 based on the current, the flux linkage, and a preset electromagnetic torque calculation formula, where the electromagnetic torque calculation formula is expressed as: $T_{elc}=1.5*Pn*(\psi_d*iq-w_q*id)$, where, $T_{elc}$ is the electromagnetic torque, Pn is the number of pole pairs of the motor, iq is the q-axis current, id is the d-axis current, $\psi_q$ is the q-axis flux linkage, and $\psi_d$ is the d-axis flux linkage.

The number of pole pairs of the motor is known information. The two-phase current and the two-phase flux linkage have been determined in step 320 and step 330 respectively. The electromagnetic torque can be determined by substituting the parameters into the calculation formula.

In this embodiment of this application, the electromagnetic torque is effectively determined based on the two-phase current, the two-phase flux linkage, and the preset electromagnetic torque calculation formula.

After the electromagnetic torque is determined in step 340, the rotation speed and the electromagnetic torque are input into a preset status observer in step 350, so as to obtain an observed value of an actual output torque of the motor 11, where the observed value is output by the status observer.

The preset status observer is an observer constructed based on a torque status space. The torque status space may be established based on a mechanical motion equation of a drive motor, and the drive motor is the motor 11.

In this embodiment of this application, the preset status observer may be a sliding mode observer, a Luenberger observer, or the like. The mechanical motion equations of the drive motors corresponding to different status observers are the same, but some of the parameters will be different in constructing the torque status space. In step 350, the preset status observer means a status observer for which the torque status space has been constructed, and can directly output the observed value of the actual output torque.

The following description uses the construction of the torque status space of a Luenberger observer as an example. Other types of status observers can be constructed correspondingly by referring to the construction of the torque status space of the Luenberger observer, thereby being finally applied to the determining of the actual output torque.

The mechanical motion equation of the drive motor is $$\frac{dw_m}{dt} = (T_{elc} - T_{load} - B*w_m)/J,$$

where, $w_m$, is a real-time rotation speed of the drive motor, that is, the rotation speed collected by the rotation speed and angle sampling module 132; $T_{elc}$ is the electromagnetic torque of the drive motor, that is, the electromagnetic torque determined in step 330; $T_{load}$ is the actual output torque of the drive motor, and is a parameter that needs to be determined; B is a damping coefficient of the drive motor, and is known information; J is a moment of inertia of the drive motor, and is known information.

Based on the mechanical motion equation, the corresponding torque status space can be established, in which: status parameters include the rotation speed and the actual output torque of the drive motor:

$$s = \begin{bmatrix} w_m \\ T_{load} \end{bmatrix};$$

an input parameter is the electromagnetic torque: $i=T_{elc}$; and an output parameter is the rotation speed of the drive motor: $o=w_m$. When the control frequency of the motor controller 12 is very high, the sampling period is measured in microseconds. In a time length measured in microseconds, it may be considered that the actual output torque is a constant value. Therefore, the status space may be further expressed as:

$$\begin{bmatrix} \dot{w}_m \\ \dot{T}_{load} \end{bmatrix} = \begin{bmatrix} -B/J & -1/J \\ 0 & 0 \end{bmatrix}\begin{bmatrix} w_m \\ T_{load} \end{bmatrix} + \begin{bmatrix} 1/J \\ 0 \end{bmatrix}*T_{elc}; o = \begin{bmatrix} 1 & 0 \end{bmatrix}\begin{bmatrix} w_m \\ T_{load} \end{bmatrix}.$$

A generic form of the foregoing expression is: $s=A*\hat{s}+B*i+L*(o-\hat{o})$; $\hat{o}=C*\hat{s}+D*i$. In the expression above, A, B, C, D are preset parameters of the status observer, and depend on the specific status observer. It needs to be noted that the preset parameter B here is different from the damping coefficient B in the preceding embodiment.

The generic form is further transformed into the preset status observer calculation formula, expressed as:

$$\dot{\hat{w}}_m = \frac{1}{J}*(T_{elc} - \hat{T}_{load} - B*\hat{w}_m + J*L1*(w_m - \hat{w}_m)),$$

$$\dot{\hat{T}}_{load} = L2*(w_m - \hat{w}_m).$$

In the formula above, $\dot{\hat{w}}_m$ is a derivative of the observed value of the rotation speed, $\hat{T}_{load}$ is the observed value of the actual output torque, $\dot{\hat{T}}_{load}$ is a derivative of the observed value of the actual output torque, L1 is a preset first control parameter, and L2 is a preset second control parameter. The observed value of the rotation speed may be determined by integrating the derivative of the observed value of the rotation speed.

The preset first control parameter and the preset second control parameter are fixed control parameters of the motor 11, and the specific values thereof are not limited here.

In step 350, the rotation speed and the electromagnetic torque are input into the preset Luenberger observer, so that the Luenberger observer can determine the observed value of the actual output torque based on the above calculation formula, the rotation speed, and the electromagnetic torque, and then output the observed value. The observed value of the actual output torque may be understood as a value obtained after a theoretical actual output torque is corrected by the status observer; or may be understood as an actual output torque observed by the status observer.

In this embodiment of this application, the actual output torque can be obtained accurately and reliably through the Luenberger observer.

After the observed value of the actual output torque, which is output by the status observer, is obtained in step 350, the motor controller 12 may transmit the observed value of the actual output torque to a vehicle controller. The vehicle controller performs subsequent control. However, considering that the actual output torque are affected by other external factors such as wind friction force and temperature, in this embodiment of this application, the observed value of the actual output torque may be corrected to obtain a more accurate actual output torque.

In a first implementation, the obtaining method further includes: obtaining status information of the motor 11; obtaining a wind friction force of the motor 11 at the rotation speed; and correcting the observed value of the actual output torque based on the status information and the wind friction force, so as to obtain a corrected actual output torque.

Both the status information and the wind friction force of the motor 11 can be measured by a dynamometer. Therefore, the motor controller 12 can obtain the status information and the wind friction force from the dynamometer.

The status information may include: information indicating whether the motor 11 is in an electromotive state or a feeding state, and whether the motor 11 is rotating forward or reversely. When the motor 11 is in an electromotive state, a product of the actual output torque of the motor 11 and the actual rotation speed is positive, and the motor may rotate forward or reversely. When the motor 11 is in a feeding state, the rotation speed of the motor 11 is in a decelerating state.

In this implementation, by obtaining the status information and the wind friction force of the motor 11, the observed value of the actual output torque is corrected, thereby further improving the accuracy of the actual output torque.

The observed value of the actual output torque can be corrected accordingly based on different status information. In an implementation, the correcting the observed value of the actual output torque based on the status information and the wind friction force, so as to obtain a corrected actual output torque, includes: subtracting, when determining that the status information is that the motor 11 is in an electromotive state and the motor 11 is rotating forward, the wind friction force from the observed value of the actual output torque to obtain the corrected actual output torque.

In this implementation, when it is determined that the motor 11 is in the electromotive state and the motor is rotating forward, the wind friction force reduces the actual output torque. The wind friction force is subtracted from the observed value of the actual output torque to obtain a more accurate actual output torque.

In another implementation, the correcting the observed value of the actual output torque based on the status information and the wind friction force, so as to obtain a corrected actual output torque, includes: adding, when determining that the status information is that the motor 11 is in an electromotive state and the motor 11 is rotating reversely, the observed value of the actual output torque and the wind friction force to obtain the corrected actual output torque.

In this implementation, when it is determined that the motor is in the electromotive state and the motor is rotating reversely, the wind friction force increases the actual output torque. The observed value of the actual output torque and the wind friction force are added to obtain a more accurate actual output torque.

In addition, when the motor 11 is in the feeding state, the wind friction force poses just a small impact on the actual output torque. Therefore, the observed value of the actual output torque does not need to be corrected.

When a new energy vehicle works in different conditions, the temperature of the drive motor varies greatly. The temperature, in addition to the wind friction force that affects the actual output torque, also poses an impact on the actual output torque. Therefore, as a second correction manner, the obtaining method further includes: obtaining the temperature of the motor 11; determining, based on the temperature and a preset correspondence, a deviation coefficient corresponding to the temperature, where the preset correspondence is a correspondence between the temperature and the deviation coefficient; and correcting the observed value of the actual output torque based on the deviation coefficient corresponding to the temperature, so as to obtain a corrected actual output torque.

The temperature of the motor 11 is the temperature collected by the temperature sampling module 13. Therefore, the motor controller 12 can obtain the temperature of the motor 11 from the temperature sampling module 13.

The preset correspondence is a correspondence between the temperature and the deviation coefficient. As an implementation, a manner of presetting the correspondence is: under different temperature conditions, testing an estimated torque of the observer, where the estimated torque is an observed value of the actual output torque output by the observer; and measuring the actual output torque of the motor 11 with a dynamometer; and then determining a deviation coefficient corresponding to each different temperature based on the estimated torque and the actual output torque.

To be specific, the dynamometer propels, in a rotation speed mode, the tested motor to run in a rated rotation speed of the tested motor, the tested motor runs in a torque mode, and a rated torque instruction to the tested motor is given. The tested motor is left to gradually heat up from a zero degree Celsius to a maximum operating temperature of the tested motor. A data group that includes the observed value of the actual output torque and the measured actual output torque is recorded at intervals of 10 degrees Celsius.

Further, the deviation coefficient K may be expressed as: $k=(\hat{T}_{load}-T_{act})/\hat{T}_{load}$, where, $\hat{T}_{load}$ is the observed value of the actual output torque that is output by the observer, and $T_{act}$ is the actual output torque measured by the dynamometer.

The deviation coefficient K and the corresponding temperature are stored correspondingly to complete the presetting of the correspondence. In storing the data, the deviation coefficient K and the corresponding temperature are made into a one-dimensional table to facilitate the use of the correspondence.

Based on the preset correspondence and the real-time temperature, the correspondence table is searched for the deviation coefficient corresponding to the real-time temperature, so that the observed value of the actual output torque can be corrected based on the corresponding deviation coefficient.

In this embodiment of this application, a correspondence between the temperature and the deviation coefficient is preset. The corresponding deviation coefficient is determined based on the temperature of the motor 11. The observed value of the actual output torque is corrected based on the deviation coefficient, thereby further improving the accuracy of the actual output torque.

During the correction, in an implementation, the corrected actual output torque is expressed as: $T_{act}=(1-K)\times\hat{T}_{load}$, where, K is the deviation coefficient corresponding to the temperature, and $\hat{T}_{load}$ is the observed value of the actual output torque.

After the observed value of the actual output torque is corrected based on the foregoing formula, a corrected observed value of the actual output torque can be obtained.

The above two implementations correspond to two correction manners based on two factors: wind friction force, and temperature, respectively. In actual applications, the observed value of the actual output torque may be corrected in just one of the correction manners, or in both of the correction manners, without being limited here.

Figure 4:
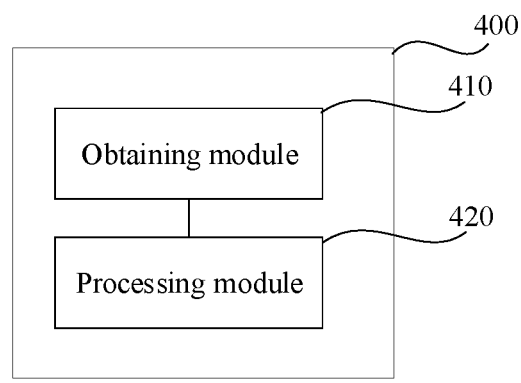
FIG. 4 is a schematic structural diagram of a torque obtaining device according to an embodiment this application.

Based on the same inventive concept, referring to FIG. 4, an embodiment of this application further provides a torque obtaining device 400, including: an obtaining module 410 and a processing module 420.

The obtaining module 410 is configured to: obtain a rotation speed of a motor 11; obtain a current of the motor 11; obtain a flux linkage of the motor 11. The processing module 420 is configured to: determine an electromagnetic torque of the motor 11 based on the current and the flux linkage; and input the rotation speed and the electromagnetic torque into a preset status observer, and obtain an observed value of an actual output torque of the motor 11, where the observed value is output by the status observer.

In this embodiment of this application, the processing module 420 is specifically configured to: determine the electromagnetic torque of the motor 11 based on the current, the flux linkage, and a preset electromagnetic torque calculation formula, where the electromagnetic torque calculation formula is expressed as: $T_{elc}=1.5*Pn*(\psi_d*iq-\psi_q*id)$, where, $T_{elc}$ is the electromagnetic torque, Pn is the number of pole pairs of the motor 11, iq is the q-axis current, id is the d-axis current, $\psi_q$ is the q-axis flux linkage, and $\psi_d$ is the d-axis flux linkage.

In this embodiment of this application, the obtaining module 410 is specifically configured to: obtain an internal resistance of a winding of the motor 11; determine a q-axis voltage based on the q-axis current and a preset q-axis current, and determine a d-axis voltage based on the d-axis current and a preset d-axis current; and determine the d-axis flux linkage based on the internal resistance of the winding, the rotation speed, and the q-axis voltage, and determine the q-axis flux linkage based on the internal resistance of the winding, the rotation speed, and the d-axis voltage.

In this embodiment of this application, the obtaining module 410 is specifically configured to obtain a three-phase current of the motor 11 and a rotor angle of the motor 11; and determine a two-phase current of the motor 11 based on the three-phase current, the rotor angle, and a preset coordinate transformation algorithm.

In this embodiment of this application, the obtaining module 410 is further configured to: obtain status information of the motor 11; and obtain a wind friction force of the motor 11 at the rotation speed. The processing module 420 is further configured to: correct the observed value of the actual output torque based on the status information and the wind friction force, so as to obtain a corrected actual output torque.

In this embodiment of this application, the processing module 420 is specifically configured to: subtract, when determining that the status information is that the motor 11 is in an electromotive state and the motor 11 is rotating forward, the wind friction force from the observed value of the actual output torque to obtain the corrected actual output torque.

In this embodiment of this application, the processing module 420 is specifically configured to: add, when determining that the status information is that the motor 11 is in an electromotive state and the motor 11 is rotating reversely, the observed value of the actual output torque and the wind friction force to obtain the corrected actual output torque.

In this embodiment of this application, the obtaining module 410 is further configured to obtain a temperature of the motor 11. The processing module 420 is further configured to: determine, based on the temperature and a preset correspondence, a deviation coefficient corresponding to the temperature, where the preset correspondence is a correspondence between the temperature and the deviation coefficient; and correct the observed value of the actual output torque based on the deviation coefficient corresponding to the temperature, so as to obtain a corrected actual output torque.

The torque obtaining device 400 corresponds to the torque obtaining method described in the preceding embodiment, and each function module corresponds to each step of the torque obtaining method. Therefore, the implementation of each function module can be learned by referring to the implementation of each step, and is omitted here.

Figure 5:
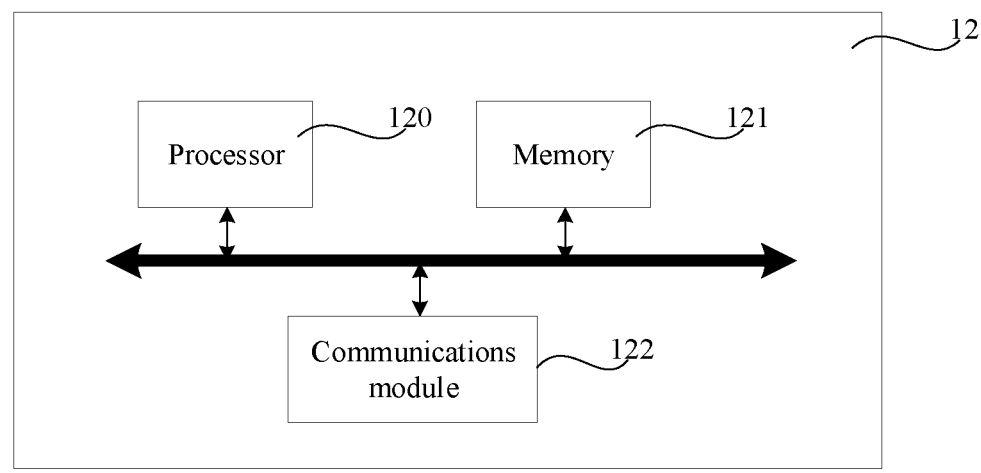
FIG. 5 is a schematic structural diagram of a motor controller according to an embodiment of this application.

Based on the same inventive concept, referring to FIG. 5, an embodiment of this application further provides a motor controller 12, including: a processor 120, a memory 121, and a communications module 122.

The processor 120, the memory 121, and the communications module 122 are electrically connected to each other directly or indirectly to transmit or exchange data. For example, such components may be electrically connected to each other by one or more communications buses or signal buses. The torque obtaining method includes at least one software function module that can be stored in the memory 121 in the form of software or firmware.

The processor 120 may be an integrated circuit chip capable of processing signals. The processor 120 may be a general-purpose processor, such as a central processing unit (CPU) or a network processor (NP); or may be a digital signal processor, an application-specific integrated circuit, a field programmable gate array or other programmable logical device, a discrete gate or a transistor logical device, or a discrete hardware component. The processor can implement or perform the methods, steps, and logical block diagrams disclosed in any embodiment of this application. The general-purpose processor may be a microprocessor, or the processor may be any conventional processor or the like.

The memory 121 may store various software programs and modules, such as program instructions or modules corresponding to the torque obtaining method according to the embodiments of this application. By running the software programs and modules stored in the memory 121, the processor 120 performs various functionalities and data processing, that is, implements the technical solutions according to the embodiments of this application.

The memory 121 may be, but is not limited to, a random access memory (RAM), a read-only memory (ROM), a programmable read-only memory (PROM), an erasable programmable read-only memory (EPROM), an electric erasable programmable read-only memory (EEPROM), or the like.

The communications module 122 is configured to implement communications connection between the motor controller 12, the sampling module 13, and a vehicle controller, and may be: a wireless communications module, a Bluetooth communications module, or a 4G/5G communications module, or the like.

Understandably, the components shown in FIG. 5 are merely an example, and the motor controller 12 may include more components.

Another embodiment of this application further provides a vehicle, including a drive motor 11 and a motor controller 12; or the drive system 10 described in the preceding embodiment.

The vehicle may be a new energy vehicle, in which a drive motor may be a permanent-magnet synchronous motor.

The vehicle may further include components such as a vehicle controller, a power battery, and a battery management system, without being limited here.

Another embodiment of this application further provides a readable storage medium. A computer program is stored in the readable storage medium. When run by a computer, the computer program performs the torque obtaining method according to the embodiments of this application.

Although this application has been described with reference to exemplary embodiments, various improvements may be made to the embodiments without departing from the scope of this application, and the components therein may be replaced with equivalents. Particularly, to the extent that no structural conflict exists, various technical features mentioned in various embodiments can be combined in any manner. This application is not limited to the specific embodiments disclosed herein, but includes all technical solutions falling within the scope of the claims.

What is claimed is:

1. A method for obtaining a torque of a motor, comprising:
   obtaining a rotation speed of the motor;
   obtaining a current of the motor, the current comprising a q-axis current and a d-axis current;
   obtaining a flux linkage of the motor, the flux linkage comprising a q-axis flux linkage and a d-axis flux linkage, and obtaining the flux linkage of the motor comprising:
      obtaining an internal resistance of a winding of the motor;
      determining a q-axis voltage based on the q-axis current and a preset q-axis current, and determining a d-axis voltage based on the d-axis current and a preset d-axis current; and
      determining the d-axis flux linkage based on the internal resistance of the winding, the rotation speed, and the q-axis voltage, and determining the q-axis flux linkage based on the internal resistance of the winding, the rotation speed, and the d-axis voltage;
   determining an electromagnetic torque of the motor based on the current and the flux linkage; and
   inputting the rotation speed and the electromagnetic torque into a preset status observer, and obtaining an observed value of an actual output torque of the motor, wherein the observed value is output by the status observer.

2. The method according to claim 1, wherein the preset status observer outputs the observed value of the actual output torque of the motor based on the following calculation formula:

$$\dot{\hat{w}}_m = \frac{1}{J} * (T_{elc} - \hat{T}_{load} - B * \hat{w}_m + J * L1 * (w_m - \hat{w}_m)),$$

$$\dot{\hat{T}}_{load} = L2 * (w_m - \hat{w}_m),$$

wherein, $w_m$ is the rotation speed, $T_{elc}$ is the electromagnetic torque, $\hat{w}_m$ is an observed value of the rotation speed, B is a damping coefficient of the motor, J is a moment of inertia of the motor, $\dot{\hat{w}}_m$ is a derivative of the observed value of the rotation speed, $\hat{T}_{load}$ is the observed value of the actual output torque, $\dot{\hat{T}}_{load}$ is a derivative of the observed value of the actual output torque, L1 is a preset first control parameter, and L2 is a preset second control parameter; and
the observed value of the rotation speed is determined by integrating the derivative of the observed value of the rotation speed.

3. The method according to claim 1, wherein determining the electromagnetic torque of the motor based on the current and the flux linkage comprises:
   determining the electromagnetic torque of the motor based on the current, the flux linkage, and a preset electromagnetic torque calculation formula, wherein
   the electromagnetic torque calculation formula is expressed as: $T_{elc} = 1.5 * Pn * (\psi_d * iq - \psi_q * id)$,
   wherein, $T_{elc}$ is the electromagnetic torque, Pn is a number of pole pairs of the motor, iq is the q-axis current, id is the d-axis current, $\psi_q$ is the q-axis flux linkage, and $\psi_d$ is the d-axis flux linkage.

4. The method according to claim 1, wherein the d-axis flux linkage is expressed as: $\psi_d = (uq - Rs * iq)/w_m$, and the q-axis flux linkage is expressed as: $\psi_q = (-ud + Rs * id)/w_m$,
   wherein, Rs is the internal resistance of the winding, $w_m$ is the rotation speed, uq is the q-axis voltage, and ud is the d-axis voltage.

5. The method according to claim 1, wherein obtaining the current of the motor comprises:
   obtaining a three-phase current of the motor and a rotor angle of the motor; and
   determining a two-phase current of the motor based on the three-phase current, the rotor angle, and a preset coordinate transformation algorithm.

6. The method according to claim 1, further comprising:
   obtaining status information of the motor;
   obtaining a wind friction force of the motor at the rotation speed; and
   correcting the observed value of the actual output torque based on the status information and the wind friction force to obtain a corrected actual output torque.

7. The method according to claim 6, wherein correcting the observed value of the actual output torque based on the status information and the wind friction force to obtain the corrected actual output torque comprises:
   subtracting, when determining that the status information is that the motor is in an electromotive state and the motor is rotating forward, the wind friction force from the observed value of the actual output torque to obtain the corrected actual output torque.

8. The method according to claim 6, wherein correcting the observed value of the actual output torque based on the status information and the wind friction force to obtain the corrected actual output torque comprises:
   adding, when determining that the status information is that the motor is in an electromotive state and the motor is rotating reversely, the observed value of the actual output torque and the wind friction force to obtain the corrected actual output torque.

9. The method according to claim 1, further comprising:
   obtaining a temperature of the motor;
   determining, based on the temperature and a preset correspondence, a deviation coefficient corresponding to the temperature, wherein the preset correspondence is a correspondence between the temperature and the deviation coefficient; and
   correcting the observed value of the actual output torque based on the deviation coefficient corresponding to the temperature to obtain a corrected actual output torque.

10. The method according to claim 9, wherein the corrected actual output torque is expressed as: $T_{act} = (1-K) \times \hat{T}_{load}$,
   wherein, K is the deviation coefficient corresponding to the temperature, and $\hat{T}_{load}$ is the observed value of the actual output torque.

11. A motor controller, comprising a processor and a memory communicationally connected to the processor,
wherein, the memory stores an instruction executable by the processor, and the instruction is executed by the processor so that the processor is enabled to perform the torque obtaining method according to claim 1.

12. A device for obtaining a torque of a motor, the device comprising:
an obtaining module, configured to:
obtain a rotation speed;
obtain a current of the motor, the current comprising a q-axis current and a d-axis current; and
obtain a flux linkage of the motor, the flux linkage comprising a q-axis flux linkage and a d-axis flux linkage, and obtaining the flux linkage of the motor comprising:
obtaining an internal resistance of a winding of the motor;
determining a q-axis voltage based on the q-axis current and a preset q-axis current, and determine a d-axis voltage based on the d-axis current and a preset d-axis current; and
determining the d-axis flux linkage based on the internal resistance of the winding, the rotation speed, and the q-axis voltage, and determine the q-axis flux linkage based on the internal resistance of the winding, the rotation speed, and the d-axis voltage; and
a processing module, configured to:
determine an electromagnetic torque of the motor based on the current and the flux linkage; and
input the rotation speed and the electromagnetic torque into a preset status observer, and obtain an observed value of an actual output torque of the motor, wherein the observed value is output by the status observer.

13. The device according to claim 12, wherein the preset status observer outputs the observed value of the actual output torque of the motor based on the following calculation formula:

$$\dot{\hat{w}}_m = \frac{1}{J} * (T_{elc} - T_{load} - B * \hat{w}_m + J * L1 * (w_m - \hat{w}_m)),$$

$$\dot{\hat{T}}_{load} = L2 * (w_m - \hat{w}_m),$$

wherein, $w_m$ is the rotation speed, $T_{elc}$ is the electromagnetic torque, $\hat{w}_m$ is an observed value of the rotation speed, B is a damping coefficient of the motor, J is a moment of inertia of the motor, $\dot{\hat{w}}_m$ is a derivative of the observed value of the rotation speed, $\hat{T}_{load}$ is the observed value of the actual output torque, $\dot{\hat{T}}_{load}$ is a derivative of the observed value of the actual output torque, L1 is a preset first control parameter, and L2 is a preset second control parameter; and
the observed value of the rotation speed is determined by integrating the derivative of the observed value of the rotation speed.

14. The device according to claim 12, wherein the processing module is further configured to: determine an electromagnetic torque of the motor based on the current, the flux linkage, and a preset electromagnetic torque calculation formula, wherein
the electromagnetic torque calculation formula is expressed as: $T_{elc}=1.5*Pn*(\psi_d*iq-\psi_q*id)$,
wherein, $T_{elc}$ is the electromagnetic torque, Pn is a number of pole pairs of the motor, iq is the q-axis current, id is the d-axis current, $\psi_d$ is the q-axis flux linkage, and $\psi_d$ is the d-axis flux linkage.

15. The device according to claim 12, wherein the d-axis flux linkage is expressed as: $\psi_d=(uq-Rs*iq)/w_m$, and the q-axis flux linkage is expressed as: $\psi_q=(-ud+Rs*id)/w_m$,
wherein, Rs is the internal resistance of the winding, $w_m$ is the rotation speed, uq is the q-axis voltage, and ud is the d-axis voltage.

16. The device according to claim 12, wherein the obtaining module is further configured to:
obtain a three-phase current of the motor and a rotor angle of the motor; and
determine a two-phase current of the motor based on the three-phase current, the rotor angle, and a preset coordinate transformation algorithm.

17. The device according to claim 12, wherein;
the obtaining module is further configured to:
obtain status information of the motor; and
obtain a wind friction force of the motor at the rotation speed; and
the processing module is further configured to:
correct the observed value of the actual output torque based on the status information and the wind friction force to obtain a corrected actual output torque.

18. The device according to claim 12, wherein:
the obtaining module is further configured to: obtain a temperature of the motor; and
the processing module is further configured to:
determine, based on the temperature and a preset correspondence, a deviation coefficient corresponding to the temperature, wherein the preset correspondence is a correspondence between the temperature and the deviation coefficient; and
correct the observed value of the actual output torque based on the deviation coefficient corresponding to the temperature to obtain a corrected actual output torque.

* * * * *